United States Patent [19]

Akiyama et al.

[11] Patent Number: 4,596,604
[45] Date of Patent: Jun. 24, 1986

[54] METHOD OF MANUFACTURING A MULTILAYER SEMICONDUCTOR DEVICE

[75] Inventors: Shigenobu Akiyama, Hirakata; Yasuaki Terui, Neyagawa; Shin-ichi Ogawa, Katano, all of Japan

[73] Assignee: Agency of Industrial Science and Technology, Tokyo, Japan

[21] Appl. No.: 661,709

[22] Filed: Oct. 17, 1984

[30] Foreign Application Priority Data

Oct. 22, 1983 [JP] Japan ................................ 58-196962

[51] Int. Cl.⁴ ...................... H01L 21/265; C30B 33/00
[52] U.S. Cl. ......................................... 148/1.5; 29/571; 29/576 B; 29/577 C; 29/576 T; 148/175; 148/187; 357/23.1; 357/91
[58] Field of Search ................. 148/1.5, 175, 187; 29/571, 576 B, 576 T, 577 C; 357/23, 91

[56] References Cited

U.S. PATENT DOCUMENTS

| | | | |
|---|---|---|---|
| 4,381,201 | 4/1983 | Sakurai | 148/1.5 |
| 4,395,433 | 7/1983 | Nagakubo et al. | 148/1.5 |
| 4,407,060 | 10/1983 | Sakurai | 148/1.5 |
| 4,414,242 | 11/1983 | Nishimura et al. | 427/53.1 |
| 4,448,632 | 5/1984 | Akasaka | 148/1.5 |
| 4,462,150 | 7/1984 | Nishimura et al. | 29/576 B |
| 4,487,635 | 12/1984 | Kugimiya et al. | 148/1.5 |
| 4,488,348 | 12/1984 | Jolly | 29/571 |
| 4,489,478 | 12/1984 | Sakurai | 148/1.5 |
| 4,494,300 | 1/1985 | Schwuttke et al. | 29/571 |
| 4,523,962 | 6/1985 | Nishimura | 148/1.5 |

OTHER PUBLICATIONS

"Multilayer CMOS Device Fabricated on Laser Recrystallized Silicon Islands," Akiyama et al., International Electron Devices Meeting, Wash., 1983, p. 352.
"Transient Heating with Graphic Heaters for Semiconductor Processing", Fan et al., Laser and Electron-Beam Interactions with Solids, (1982).
"3-Dimensional SOI/CMOS IC's Fabricated by Beam Recrystallization," Kawamura et al., IEDM 1983.

Primary Examiner—Upendra Roy
Attorney, Agent, or Firm—Spencer & Frank

[57] ABSTRACT

A method of obtaining a multilayer semiconductor device by forming a semiconductor crystallized layer through an insulative material over a semiconductor substrate in which a semiconductor device is formed. The insulative material is formed on the semiconductor substrate in which the semiconductor device is fabricated and a first semiconductor layer is formed on the insulative material. Thereafter, the surface of the first semiconductor layer is planarized and an insulative material is formed on this planarized surface, then a second semiconductor layer is formed on this insulative material. Next, the second semiconductor layer is crystallized by the irradiation of an energy beam, thereby fabricating a device in the second crystallized semiconductor layer.

16 Claims, 13 Drawing Figures

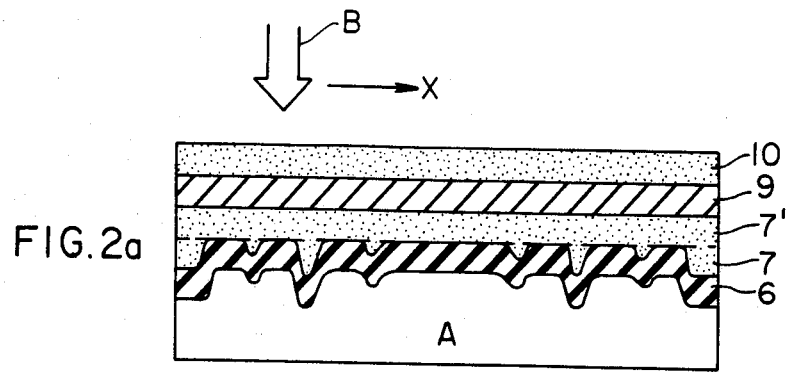
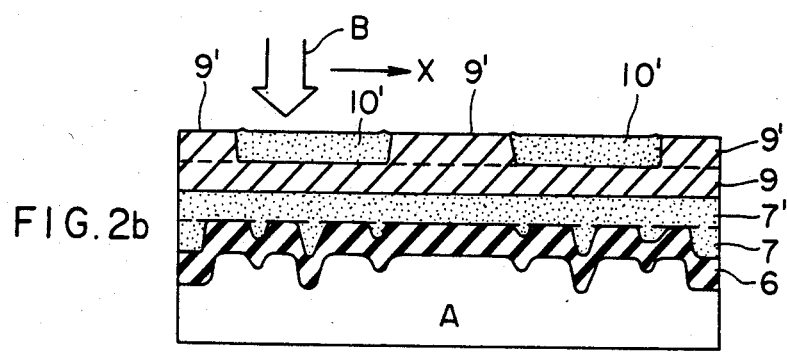
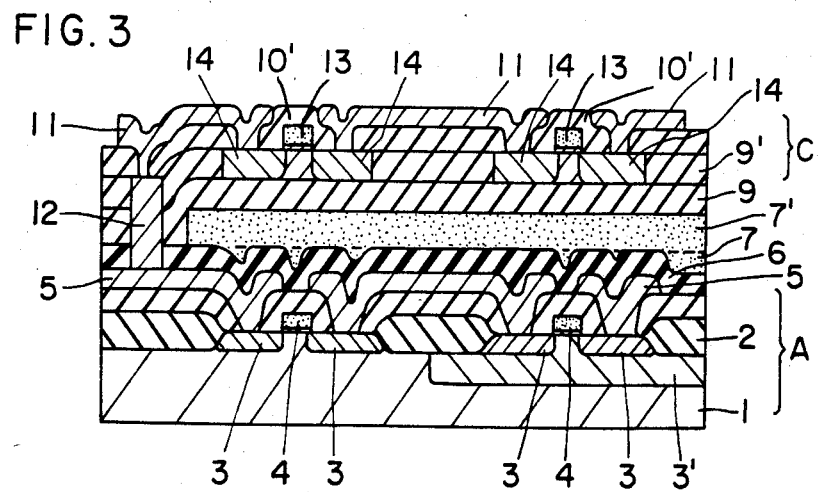

METHOD OF MANUFACTURING A MULTILAYER SEMICONDUCTOR DEVICE

BACKGROUND OF THE INVENTION

The present invention relates to a method of manufacturing a semiconductor device having a structure wherein active regions are stacked, such as a transistor or the like and which is known as a three-dimensional IC.

In recent years, many technologies and structures have been proposed with respect to a technology for forming a stacked single crystalline semiconductor layer as the most fundamental and important technology in the manufacture of the so-called three-dimensional IC, particularly with regard to the SOI (Semiconductor On Insulator) structure. For example, there are the zone melting method employing a carbon strip heater or the like, and a method whereby the recrystallization is performed by irradiating with laser or electron beam, and the like. In the heating method employing a carbon heater or the like, the whole substrate is heated to over 1000° C. from a long time. Therefore, this method is suitable for obtaining only the SOI structure. However, it is difficult to apply such a method to the case of manufacturing a three-dimensional IC in which active layers including devices are stacked because the devices which have already been formed in the lower layer are thermally damaged and eventually broken.

Therefore, in order to obtain a single crystalline layer in the stacked structure, a recrystallizing method employing irradiation with a laser or electron beam to effect local heating of only the surface layer is highlighted as an effective means. As conventional examples, most such methods adopt the SOI structure and in such a case, a flat uniform insulating film is disposed under the layer to be recrystallized, so that a good crystallized layer can be easily obtained. In addition, in case of the SOI, in order to obtain a preferable crystallized semiconductor layer, as a method of obtaining a desirable temperature distribution at the time of solidification, it is desirable to provide a layer serving as a heat sink under the lower layer of the insulating film. For example, when the SOI is constituted by forming an insulative material on a silicon substrate, this silicon substrate functions as a heat sink.

On the other hand, a few so-called three-dimensional devices in which devices of two or more layers are stacked have been proposed so far. However, most of them are constituted by merely stacking a transistor through an insulating film, so that the crystalline property and the like of the semiconductor layer of the upper layer in which a device should be formed are not good and the electrical characteristics of the device are not good.

Namely, when the crystalline semiconductor layer of the second layer in which a device should be formed is melted and recrystallized due to the irradiation of a laser or electron beam, the temperature distribution is not controlled because of the rough surface shape due to the concave and convex portions of the device formed in the lower layer and because of the irregularity of wiring material and the like, or due to other reasons. Thus, nuclei will have been formed and have grown at random due to the influence of the under layer. Consequently, the recrystallized layer of the semiconductor will have become an assembly of fine crystal grains containing a number of crystal grain boundaries and defects and the like, causing degradation of electrical characteristics. Further, in case of forming the recrystallized semiconductor layer of the second layer, there are some cases where a device in the lower layer which has already been formed is thermally damaged by the beam energy of the laser or the like and its characteristics deteriorate. As mentioned above, in the manufacture of a stacked three-dimensional IC, it is extremely difficult at present to obtain single-crystallized semiconductor layers of the second and subsequent layers without causing the device in the lower layer to be damaged.

SUMMARY OF THE INVENTION

It is an object of the present invention to provide an excellent method of manufacturing a semiconductor device of a three-dimensional IC whereby a single-crystallized layer is obtained by recrystallizing an insulatively isolated semiconductor layer by means of the irradiation of an energy beam, in which by forming between the upper and the lower layers an insulatively isolated semiconductor layer which becomes a planarized heat sink layer, the above-mentioned conventional drawbacks are eliminated, thereby enabling a single-crystallized semiconductor layer to be formed on the insulatively isolated upper layer from the lower layer without causing the device in the lower layer to be damaged.

According to the present invention, an insulative material is formed on the surface of a semiconductor substrate on which the semiconductor device is formed, thereafter a semiconductor layer is coated on the surface of the insulative material so as to have a thickness which is larger than the maximum difference in step levels among the concave and convex portions on the surface of the insulative material on the device. Further, for example, a photo-resist film or the like is spin-coated on that thick semiconductor layer at a proper rotaing speed, thereby setting the difference in step level among the concave and convex portions of the surface of the photo-resist film to be preferably smaller than about up to 0.2 μm. Next, the photo-resist film and the convex portions of the above-mentioned first thick semiconductor layer are removed by etching by the use of, e.g., a dry etching apparatus of the parallel plate type or the like, thereby to planarize the surface of the first semiconductor layer on the semiconductor substrate surface through the insulative material. Subsequently, an insulative material and a second semiconductor layer are deposited on the planarized first semiconductor layer by the CVD method or the like, thereby to derive the second insulatively isolated semiconductor layer on the planarized first semiconductor layer. By irradiating an energy beam such as a laser or electron beam or the like onto the second semiconductor layer obtained by the method explained above, the second semiconductor layer is molten and recrystallized. At this time, the second recrystallized semiconductor layer becomes a single-crystallized layer or a crystallized layer consisting of large crystal grains since the planarized first semiconductor layer is the heat sink. In addition, the planarized first semiconductor layer also serves to prevent the lower layer from being thermally damaged upon irradiation by the energy beam. Therefore, by forming a device such as an integrated circuit and the like in the second single-crystallized semiconductor layer, a so-called three-dimensional IC or three-dimensional circuit device whereby the devices are formed in both lower and upper layers through the insulating film is obtained. For the device produced in this way, the device in the lower layer is not subjected to damage, while the device in the upper layer is formed in the crystallized layer which is nearly a single crystal. Consequently, the devices in the lower and upper layers obtained in this way have good electrical characteristics that are substantially equal to those of a conventional two-dimensional device.

Obviously, immediately after the formation, the first and second semiconductor layers may be amorphous or polycrystalline and it is further desirable that they are semiconductor layers of high density and high purity. If the second semiconductor layer is formed as an island structure in which it is completely embedded within an insulative material, the crystalline property of the second semiconductor layer after recrystallization will be further improved and almost all of the island can be easily single-crystallized; thus, this method is effective. On the other hand, if the device formed on the semiconductor substrate and the device formed in the second recrystallized semiconductor layer are appropriately electrically connected and they are made operative mutually, it is possible to realize the inherent function of a three-dimensional IC, namely, high-speed operation and multifunction and the like that cannot be implemented by a conventional two-dimensional IC.

BRIEF DESCRIPTION OF THE DRAWINGS

FIG. 2a is a cross sectional structural diagram showing the case where a second semiconductor layer is formed on the entire surface of a device when the second semiconductor layer is recrystallized by the irradiation of a laser beam;

FIG. 2b is a cross sectional structural diagram showing the case where islands are formed in the second semiconductor layer;

FIGS. 3 and 6 are cross sectional structural diagrams showing examples of a three-dimensional device having a two stacked layer structure formed by use of the present invention;

DESCRIPTION OF THE PREFERRED EMBODIMENTS

A method of manufacturing a semiconductor device of the multilayer type according to one embodiment of the present invention will now be described in accordance with the process diagrams shown in FIGS. 1a to 1d.

Figure 1A:
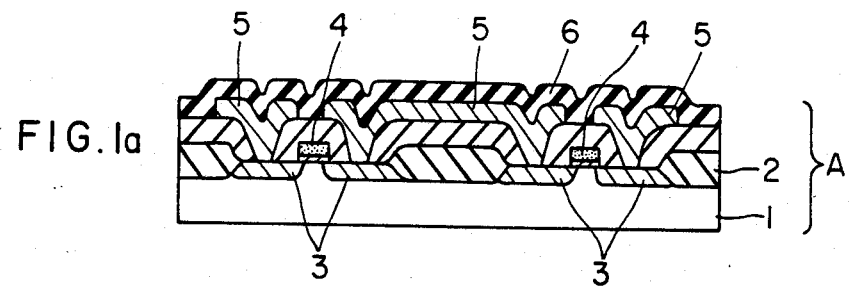
FIGS. 1a to 1d are cross sectional structural diagrams of the process showing an embodiment of the present invention for forming a second semiconductor layer through a planarized semiconductor layer.

In FIG. 1a, an LOCOS oxide film (2), source-drain diffusion layers (3), gate electrodes (4), and conductors (5) are formed over a single crystal Si substrate (1) according to an ordinary MOS process, thereby forming a device A of the first layer, e.g., an MOS transistor integrated circuit. However, as the conductors (5) in this case, it is more desirable to employ a silicide such as metal $MoSi_2$, $WSi_2$ or the like having a high melting point such as a low resistance polycrystal Si, Mo, W, etc. and a combination of them, or the like. Subsequently, in order to insulatively isolate the device A of the first layer, an insulating film (6) such as $SiO_2$, $Si_34$ or the like is formed by way of, e.g., the CVD method or the like. At this time, the concave and convex portions nearly corresponding to the concave and convex portions on the surface of the device A of the first layer remain on the surface of the insulating film (6) over the device A. With an ordinary process, the maximum difference in step levels among the concave and convex portions (i.e., the differences in the heights of the concave and convex portions) over at least the region where the device A is formed is at least 0.5 $\mu$m, ordinarily, 1.0 $\mu$m.

Figure 1B:
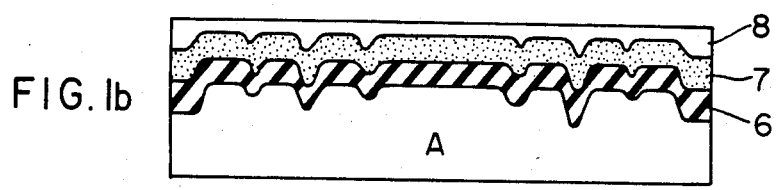
Figure 1C:
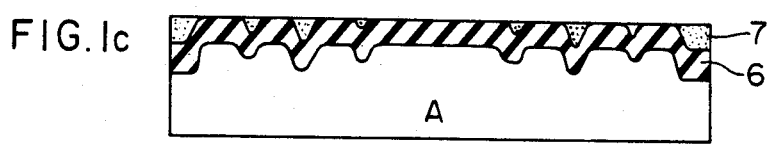

FIGS. 1b and 1c show a process to obtain a structure to reduce such concave and convex portions and thereby making them flat so that the planarized layer can be used as a heat sink. Details of the MOS transistor portion A are omitted in the figures described hereinbelow. Namely, in FIG. 1b, a first polycrystallized Si layer (7) is formed on the insulating film (6) for insulative isolation of the device A of the first layer at temperatures of about 600° C. by means of, e.g., the LPCVD method so as to have a thickness which is larger than the maximum difference in step levels among the concave and convex portions of the surface on the device A, for instance, a thickness of 1.2 $\mu$m. The concave and convex portions nearly corresponding to the concave and convex portions of the surface of the insulating film (6) remain as they are on the surface of the first polycrystalline Si layer (7).

Next, e.g., a photo-resist is coated at a rotating speed of 3000 r.p.m. according to an ordinary resist coating process, so that as shown in FIG. 1b, the surface of a resist film (8) over at least the device A becomes the flat surface since the concave and convex portions of the first polycrystalline Si layer (7) of the under layer are covered. Thereafter, by use of a parallel plate plama sputtering apparatus, etching is performed in the atmosphere of e.g., $CF_2Cl_2$ gas. At this time, by using a plasma gas atmosphere such that the etching speeds of the resist and polycrystalline Si are almost equal (for instance, it is possible to adopt the condition of $CF_2Cl_2$ at 200 mTorr and RF power of 200 W), the resist (8) and first polycrystalline Si layer (7) are removed due to the etching while maintaining the flatness of the surface of the resist (8) and at least the resist (8) can be completely removed. At the same time, the etching is performed within a range of up to the etching amount until the surface of the insulating film (6) appears. Thus, as shown in FIG. 1c, the surface of the insulating film (6) is planarized due to a structure such that at least the concave portions of the surface of the insulating film (6) are buried within the first polycrystalline Si (7).

Figure 1D:
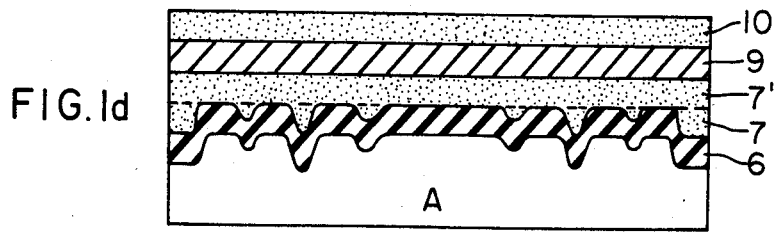

Next, as shown in FIG. 1d, a polycrystalline Si layer (7'), an insulating film (9) such as $SiO_2$, $Si_3N_4$ or the like, and further a second polycrystalline Si layer (10) are sequentially formed. Thus, it was possible to derive the first polycrystalline Si layers (7) and (7') having the planarized surfaces which were isolated by the device A of the first layer and by the insulating film (8), and further the second polycrystalline Si layer (10) isolated by the first planarized polycrystalline Si layers (7) and (7') and by the insulating film (9).

FIGS. 2a and 2b show the state whereby the second polycrystalline Si layer (10) obtained in this way is recrystallized by scanning and irradiating a CW laser beam thereon. In FIG. 2a, the sample made by the sample producing processes shown in FIGS. 1a to 1d is heated to, e.g., 300°–500° C., and an argon CW laser beam B having a power of 2 to 10 W is scanned in the direction indicated by, e.g., an arrow X at a speed of 10 cm/sec. Thus, the recrystallized layer of the second polycrystalline Si layer (10) becomes several assemblies consisting of large crystal grains. At this time, since the surface of the first semiconductor layer (7') of the under layer is planarized, the random formation of nuclei due to the steps of the concave and convex portions of the under layer does not occur. Therefore, if the energy distribution of the incident beam is constituted by, e.g., a twin peak type in which the periphery of the beams can has a high energy and control is effected such that the recrystallization starts from the central portion of the beam scan, a recrystallized layer containing large crystal grains which have a width of over ten $\mu$m and a length of hundreds of $\mu$m can be derived.

On the other hand, in the case where the whole Si layer (10) as shown in FIG. 2a is recrystallized, a number of micro crystal grains of which the polycrystalline Si on which a laser beam is not irradiated is formed as nuclei grow from the periphery of the scanning beam and they might have remained as they are. Even if the overlapping scan is performed, the micro crystal grains will have remained. To suppress such growth of the micro crystal grains from the periphery, the following methods are effective. Namely, an island structure as shown in, e.g., FIG. 2b is formed and a beam having a diameter larger than, for example, the width an island is irradiated thereon such that the entire width of the island is fused by a single beam scan, or the entire width of the island is simultaneously fused in a similar manner. This method will be explained with reference to FIG. 2b.

As shown in FIG. 2b, as the second polycrystalline Si layer (10), an island-like polycrystalline Si layer (10') surrounded by an insulative material (9') such as SiO$_2$ or the like is formed by, e.g., the CVD method. Thereafter, by scanning the laser beam B having a width greater than the width of the Si island (10') in the direction indicated by the arrow X under conditions similar to those described above the entire Si island (10') after recrystallization can be made into almost a single-crystallized layer.

That is, since the Si layer (10) to be recrystallized has an island structure, by irradiating with beam such as to cover the whole width of the island, the whole width of the island (10') is fused immediately after the irradiation. Therefore, at the interface between the island (10') and the SiO$_2$ (9) and (9') as the insulative materials, nuclei are not formed upon crystallization. Further, in the present invention, since the first polycrystalline Si layer (7') as the under layer of the island (10') is the planarized heat sink layer, the random occurrence of nuclei due to the concave and convex portions of the under layer does not occur. At the same time, the edge heating effect takes place during the recrystallization process by the beam irradiation, thereby allowing the recrystallization to easily start from the central portion of the island. Therefore, when the solidification of the central portion of the island has once started, this portion becomes the nuclei for crystallization and this nuclei grows over the island, so that the whole island becomes substantially a single crystal. Although the beam energy could have been directed into the lower layer at portions other than the island during the laser irradiation, in this invention, this energy is absorbed by the first planarized semiconductor layers (7) and (7') and is lost as heat in the lateral direction. Also, since the irradiation period at this time is a few milliseconds, this makes it possible to prevent the device A of the lower layer from being thermally damaged.

FIG. 3 shows an example of a cross sectional structure of a device having two stacked active layers formed by use of the invention. In this case, a part of the device A formed on the semiconductor substrate (1), for instance, the conductors (5) are electrically connected by inter-layer conductors (12) with conductors (11) of a device C formed in the single-crystallized Si islands (10') of which the second semiconductor layers (10) and (10') were recrystallized. As a material of the conductors (5) and inter-layer conductors (12), it is desirable to use a polycrystalline Si layer having a low resistance, or a metal silicide layer having a high melting point such as an MoSi$_2$ or WSi$_2$ layer or the like, or a metal having a high melting point such as Mo, W or the like, etc. In FIG. 3, the reference numeral (13) denotes gate electrodes of the device and (14) indicates source-drain regions.

Figure 6:
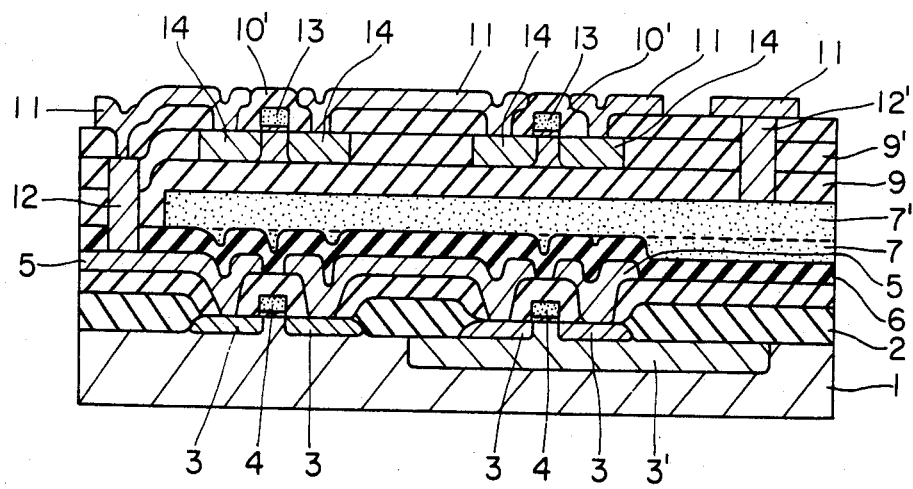

In addition, as an example, FIG. 6 shows a cross sectional structure of the first semiconductor layers (7) and (7') which are used as the planarized heat sink layers. In operation of the multilayer device, these first semiconductor layers (7) and (7') are used as the electrodes for applying the back gate voltage to the upper device C through the conductors (11) and interlayer conductors (12'), thereby reducing the leakage current of the upper device C, and at the same time playing the role of electrical shields for the upper device C due to the operation of the lower layer device A. Therefore, the first semiconductor layers (7) and (7') are convenient for the prevention of malfunctions.

Figure 4A:
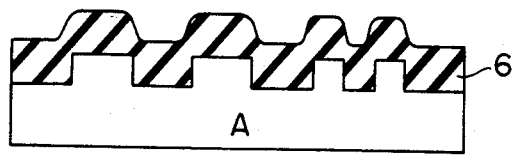
FIGS. 4a to 4d are cross sectional process diagrams showing a second embodiment of the present invention employing an under layer planarizing method.
Figure 4B:
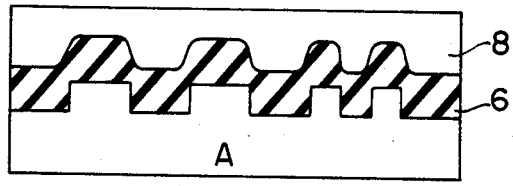
Figure 4C:
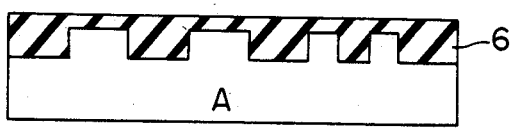
Figure 4D:
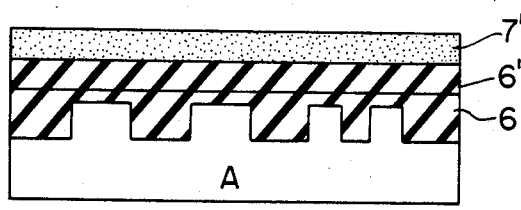

On the other hand, in the method of FIGS. 1a to 1d, it will be appreciated that before palanarizing the surface of the first polycrystalline Si layer (7), the insulating film (6) on the device A of the first layer is preliminarily planarized and thereafter the first polycrystalline Si layer (7) is formed, thereby enabling the first planarized polycrystalline Si layer (7) to be obtained. In such a case, an example of a method of planarizing the insulating film (6) whereby there is no need to form the polycrystalline Si layer (7) will be briefly explained in conjunction with FIGS. 4a to 4d. The insulating film (6) is formed on the device A of the first layer by the CVD method or the like so as to have a thickness (e.g., 1.2 $\mu$m) which is larger than the maximum difference (e.g., 1.0 $\mu$m) in step levels among the concave and convex portions of the surface of the device A (FIG. 4a). Then, as shown in FIG. 4b, the photo-resist layer (8) having a thickness of, e.g., 1.8 $\mu$m is coated on the insulating film (6), thereby planarizing the surface so that the difference in step levels among the concave and convex portions of the surface becomes 0.2 $\mu$m or less. At least the whole photo-resist film (8) and the convex portion of the insulating film (6) are then etched by a parallel plate type plasma etching apparatus so that the etching speeds of the resist and SiO$_2$ become equal (for example, under the conditions whereby CHF$_3$ and O$_2$ are used as gases, a flow rate of CHF$_3$/O$_2$ is 280/10, the degree of vacuum is 30 mTorr, and the power is 300 W), thereby planarizing the insulating film (6) as shown in FIG. 4c. Thereafter, as shown in FIG. 4d, an insulaing film (6') and the first polycrystalline Si layer (7') are sequentially formed, and then the first planarized polycrystalline Si layer (10) insulatively isolated can be deposited over the device A of the first layer in a manner similar to that shown in FIG. 1c.

Figure 5:
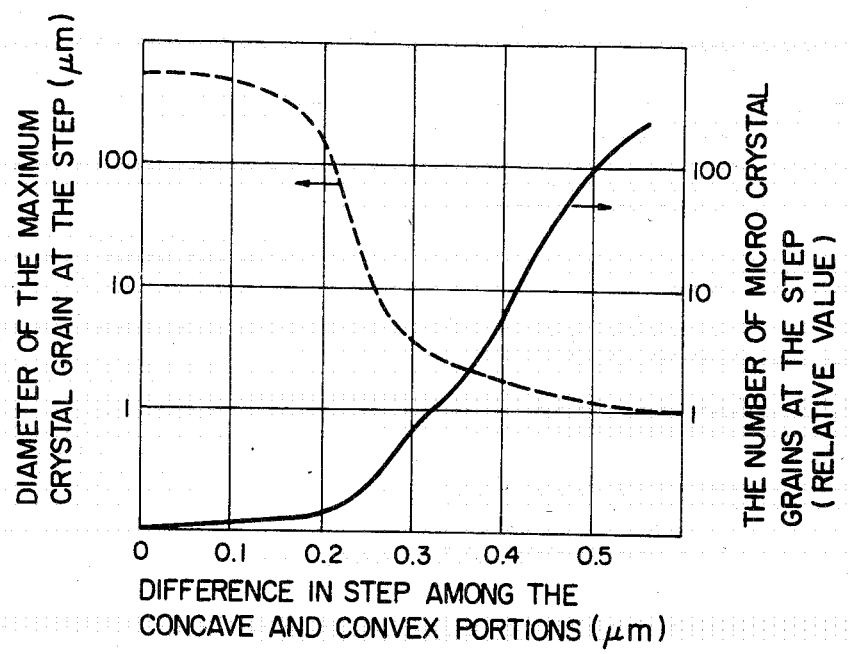
FIG. 5 is a diagram depicting the result of an experiment showing the growth state of the crystal grains in the recrystallized layer at the step portions.

On the other hand, during recrystallization of the second polycrystalline Si layers (10) and (10') by irradiation with a laser beam or the like, the inclusion of the recrystallized layer on the crystal grain due to the steps in the concave and convex portions of the under layer surface (the surface of the first polycrystalline Si layer (7')) will be explained from, for instance, the result of the experiments shown in FIG. 5. It can be seen from this graph that when the difference in step levels among the level different portions (concave and convex portions) exceeds about 0.2 $\mu$m, the micro crystal rapidly increases and the diameter of the maximum crystal grain becomes small. Therefore, in order to obtain a good crystallized layer or single-crystallized difference in step level among the concave and convex portions of the Si layer (7') as the under layer is desirably set to be about 0.2 $\mu$m or less. Obviously, no problem will be caused even if there is a difference in step level over 0.2 $\mu$m among the concave and convex portions of the under layer in the region where no device is formed.

The devices which are formed on the semiconductor substrate and in the crystallized semiconductor layer include an MOS transistor, a bipolar transistor and the like and may consist of the same kind or combinations of them. In addition, as an energy beam, even is a pulse oscillation laser or electron beam or the like is used as well as a continuous oscillation laser beam, a good result will be likewise derived.

As insulatively isolated layers among the respective layers, a laminating structure of $SiO_2$ and other materials, e.g., $Si_3N_4$ and the like in addition to $SiO_2$ also provided a good result.

It is desirable that the device fabricated on the semiconductor substrate and the device fabricated in the crystallized semiconductor layer are electrically connected by means of conductors including polycrystalline silicon, metal with a high melting point and the like. In this case, a part of the first semiconductor layer may be used as a part of the conductors by being insulatively isolated.

In the case where the second semiconductor layer has an island shape, all of the islands may have the same shape such as, e.g., a square shape, or it may be continuously formed over the whole surface without forming the island shape.

Further, as the first semiconductor layer, a composite layer of a semiconductor and a conductor such as a metal having a high melting point or the like may be also used as well as polycrystalline silicon. Although the potential is applied from the outside to the first semiconductor layer as an independent electrode, the first semiconductor layer may be internally electrically coupled in the manner such that it has the same potential as that of a part of the device formed on the semiconductor substrate or in the crystallized layer.

As is obvious from the above description, according to the invention, by forming and stacking a semiconductor device over a device such as an IC or the like, the device of the upper layer can have a good electrical characteristic similar to that of an ordinary SOI consisting of only a single layer, so that a three-dimensional IC with high performance can be realized. Further, such an IC can be manufactured by an ordinary process.

We claim:

1. A method of manufacturing a multilayer semiconductor device comprising the steps of:
    forming a first semiconductor device having a semiconductor substrate;
    forming a first insulating layer on a surface of said first semiconductor device, said insulating layer having concave and convex portions therein defining step levels corresponding to the differences in the heights of said concave and convex portions;
    forming a first semiconductor layer on the surface of said first insulating layer, said first semiconductor layer filling the concave portions of said first insulating layer and being flattened to have a planar surface;
    forming a second insulating layer on the planar surface of said first semiconductor layer;
    forming a second semiconductor layer on said second insulating layer;
    melting said second semiconductor layer by irradiation with an energy beam for the recrystallization thereof, said recrystallization converting said second semiconductor layer to a single crystal or an assembly of single crystals comprising large crystal grains; and
    forming a second semiconductor device in said recrystallized second semiconductor layer.

2. A method of manufacturing a multilayer semiconductor device according to claim 1, wherein said second semiconductor layer is amorphous or polycrystal.

3. A method of manufacturing a multilayer semiconductor device according to claim 1, wherein the maximum value of said step levels is 0.2 $\mu$m.

4. A method according to claim 1, wherein said energy beam consists of a continuous oscillation laser beam.

5. A method according to claim 1, wherein said energy beam consists of a pulse oscillation laser beam.

6. A method according to claim 1, wherein said energy beam consists of an electron beam.

7. A method according to claim 1, wherein said insulative material comprises $SiO_2$ 8. A method according to claim 1, wherein said insulative material comprises a laminating layer of $SiO_2$.

9. A method according to claim 1, wherein said first semiconductor device is electrically connected with said second semiconductor device by means of conductors which include at least polycrystalline silicon.

10. A method according to claim 1, wherein a portion of said first semiconductor layer electrically connects said first semiconductor device and said second semiconductor device.

11. A method according to claim 1, wherein said first semiconductor layer comprises an independent electrode, a predetermined potential being applied thereto.

12. A method according to claim 1, wherein said first semiconductor layer is electrically connected to said first semiconductor device, said first semiconductor device having the same potential as at least a part of said first semiconductor device.

13. A method according to claim 1, wherein said first semiconductor layer is electrically connected to said second semiconductor device, said second semiconductor device having the same potential as at least a part of said second semiconductor device.

14. A method according to claim 1, wherein said first semiconductor layer is a composite layer consisting of a semiconductor layer and a conductor layer.

15. A method of manufacturing a multilayer semiconductor device according to claim 1 wherein said first semiconductor layer functions as a heat sink and prevents thermal damage to said first semiconductor device during irradiation of said second semiconductor layer, said first semiconductor layer further electrically shielding said first and second semiconductor devices from each other thereby improving the electrical characteristics thereof.

16. A method of manufacturing a multilayer semiconductor device comprising the steps of:

forming a first semiconductor device having a semiconductor substrate;

forming a first insulating layer on a surface of said first semiconductor device, said insulating layer having concave and convex portions therein defining step levels corresponding to the differences in the heights of said concave and convex portions;

forming a heat sink layer on the surface of said first insulating layer, said heat sink layer filling the concave portions of said first insulating layer and being flattened to have a planar surface;

forming a second insulating layer on the planar surface of said heat sink layer;

forming a semiconductor layer on said second insulating layer;

melting said semiconductor layer by irradiation with an energy beam for the recrystallization thereof, said recrystallization converting said semiconductor layer to a single crystal or an assembly of single crystals comprising large crystal grains; and forming a second semiconductor device in said recrystallized semiconductor layer.

* * * * *